US011217522B2

(12) United States Patent
Shibuya

(10) Patent No.: US 11,217,522 B2
(45) Date of Patent: Jan. 4, 2022

(54) SEMICONDUCTOR APPARATUS AND METHOD HAVING A LEAD FRAME WITH FLOATING LEADS

(71) Applicant: Texas Instruments Incorporated, Dallas, TX (US)

(72) Inventor: Makoto Shibuya, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 162 days.

(21) Appl. No.: 16/440,184

(22) Filed: Jun. 13, 2019

(65) Prior Publication Data
US 2020/0395287 A1    Dec. 17, 2020

(51) Int. Cl.
*H01L 23/498* (2006.01)
*H01L 21/48* (2006.01)
*H01L 23/00* (2006.01)

(52) U.S. Cl.
CPC .... *H01L 23/49861* (2013.01); *H01L 21/4825* (2013.01); *H01L 21/4853* (2013.01); *H01L 23/49866* (2013.01); *H01L 24/16* (2013.01); *H01L 2224/16225* (2013.01); *H01L 2224/16245* (2013.01)

(58) Field of Classification Search
CPC ...................................................... H01L 24/16
See application file for complete search history.

(56) References Cited

U.S. PATENT DOCUMENTS

2018/0286787 A1* 10/2018 Huang .............. H01L 23/49827

* cited by examiner

*Primary Examiner* — Walter H Swanson
(74) *Attorney, Agent, or Firm* — Ronald O. Neerinqs; Charles A. Brill; Frank D. Cimino

(57) ABSTRACT

In described examples, a packaged semiconductor device includes a frame, a pre-fabricated interposer, and an integrated circuit die. The frame includes multiple conductive frame leads and multiple conductive connection points, as well as a hole in the frame surrounded by the frame leads and the conductive connection points. The pre-molded interposer has an external perimeter including multiple conductive interposer leads, and is for insertion into the hole. At least one of the interposer leads does not extend to the external perimeter of the interposer. The die is electrically coupled to selected ones of the frame leads and of the interposer leads. The interposer is inserted into the hole and coupled to the frame, and the frame, interposer, and die are together encapsulated by encapsulation material.

20 Claims, 12 Drawing Sheets

SEMICONDUCTOR APPARATUS AND METHOD HAVING A LEAD FRAME WITH FLOATING LEADS

BACKGROUND

This application relates generally to connections between integrated circuits and circuit boards, and more particularly to lead frames in a packaged semiconductor device.

FIG. 1A shows a prior art example of a lead frame 100. FIG. 1B shows a prior art example of a quad-flat no-leads (QFN) package 102. FIG. 1C shows a prior art example of a flip chip 104. The lead frame 100 includes a die attach pad 106 on which a control integrated circuit 107 (control IC 107) is mounted, typically using an adhesive. The control IC 107 controls input and output functions of the fully assembled package 102. The lead frame 100 also includes multiple conductive leads 108, 110 (non-floating leads 108 and floating leads 110). The flip chip 104 is electrically coupled to the lead frame 100 of FIG. 1A, and the assembled flip chip 104 and lead frame are encapsulated using encapsulation material to produce the QFN package 102 of FIG. 1B. The QFN package 102 of FIG. 1B shows a bottom side of the attach pad 109 of the lead frame 100.

FIG. 1D shows a prior art example of multiple pre-singulation QFN lead frames 100 physically connected together in an array 124. Connection points 112 and a bottom surface of the flip chip 118 are visible in FIG. 1D. After the lead frames 100 are encapsulated, the array 124 of lead frames 100 is singulated (separated using, for example, saw singulation or shear singulation) into separate, individual lead frames 100. The individual lead frames 100 can be electrically connected to circuits on a printed circuit board (PCB, not shown) surface, as further described below.

Conductive leads 108, 110 can be floating leads 110 or non-floating leads 108. Non-floating leads 108 are conductive leads 108, 110 that are electrically and mechanically connected by continuous conductive lead frame 100 structure to a connection point 112. Floating leads 110 are conductive leads 108, 110 that are not electrically and mechanically connected by continuous conductive lead frame structure to a connection point 112. Wire bonds or other electrically connective structures are added to the lead frame 100 to electrically connect floating leads 110 to respective connection points 112, prior to the flip chip 104 being attached to the lead frame 100 and the resulting fully assembled lead frame system being packaged (for example, to form a QFN package 102).

Some of the conductive leads 108, 110 are electrically connected to the control IC 107 by wire bonds 111. Connection points 112 on the lead frame 100 are conductive locations on the perimeter of the lead frame 100 that remain exposed when the lead frame 100, with a flip chip 104 (or other integrated circuit) mounted thereon, is enclosed in molding compound to form a QFN (or other) package 102. Some of the connection points 112 are electrically connected to the control IC 107, either directly using wire bonds 111, or indirectly via conductive leads 108, 110 that are electrically connected to the control IC 107 using wire bonds 111.

The QFN package 102 includes the connection points 112, which are left exposed when the lead frame 100 is encapsulated using molding compound. The QFN package's connection points 112 can be surface-mounted on a PCB to electrically connect the QFN package 102 to circuits on the PCB surface. The flip chip 104 includes conductive pads 114 on a top surface 116 of the flip chip 104. The conductive leads 108, 110 on the lead frame 100 are arranged so that the flip chip 104 can be flipped over so that its top surface 116 faces down—towards the lead frame 100—and the conductive leads 108, 110 are aligned with the conductive pads 114. The pads 114 can then be electrically and mechanically connected to the conductive leads 108, 110 using solder balls (not shown). This results in electrically coupling the circuits in the flip chip 104 to the connection points 112, via the conductive leads 108, 110. Packaging in which a flip chip is used with a lead frame is referred to as Flip Chip on Lead (FCoL) packaging.

FIG. 1E shows a prior art example of a view 120 of the flip chip 104 being placed onto a lead frame 100, in which a bottom surface 118 of the flip chip 104 is visible. FIG. 1F shows a prior art example of a view 122 of the flip chip 104 being placed onto the lead frame 100, in which the top surface 116 of the flip chip 104 is visible.

SUMMARY

In described examples, a packaged semiconductor device includes a frame, a pre-fabricated interposer, and an integrated circuit die. The frame includes multiple frame leads and multiple conductive connection points, as well as a hole in the frame surrounded by the frame leads and the conductive connection points. The pre-molded interposer has an external perimeter including multiple conductive interposer leads, and is for insertion into the hole. At least one of the interposer leads does not extend to the external perimeter of the interposer. The die is electrically coupled to selected ones of the frame leads and of the interposer leads. The interposer is inserted into the hole and coupled to the frame, and the frame, interposer, and die are together encapsulated by encapsulation material.

DETAILED DESCRIPTION

Figure 1A:
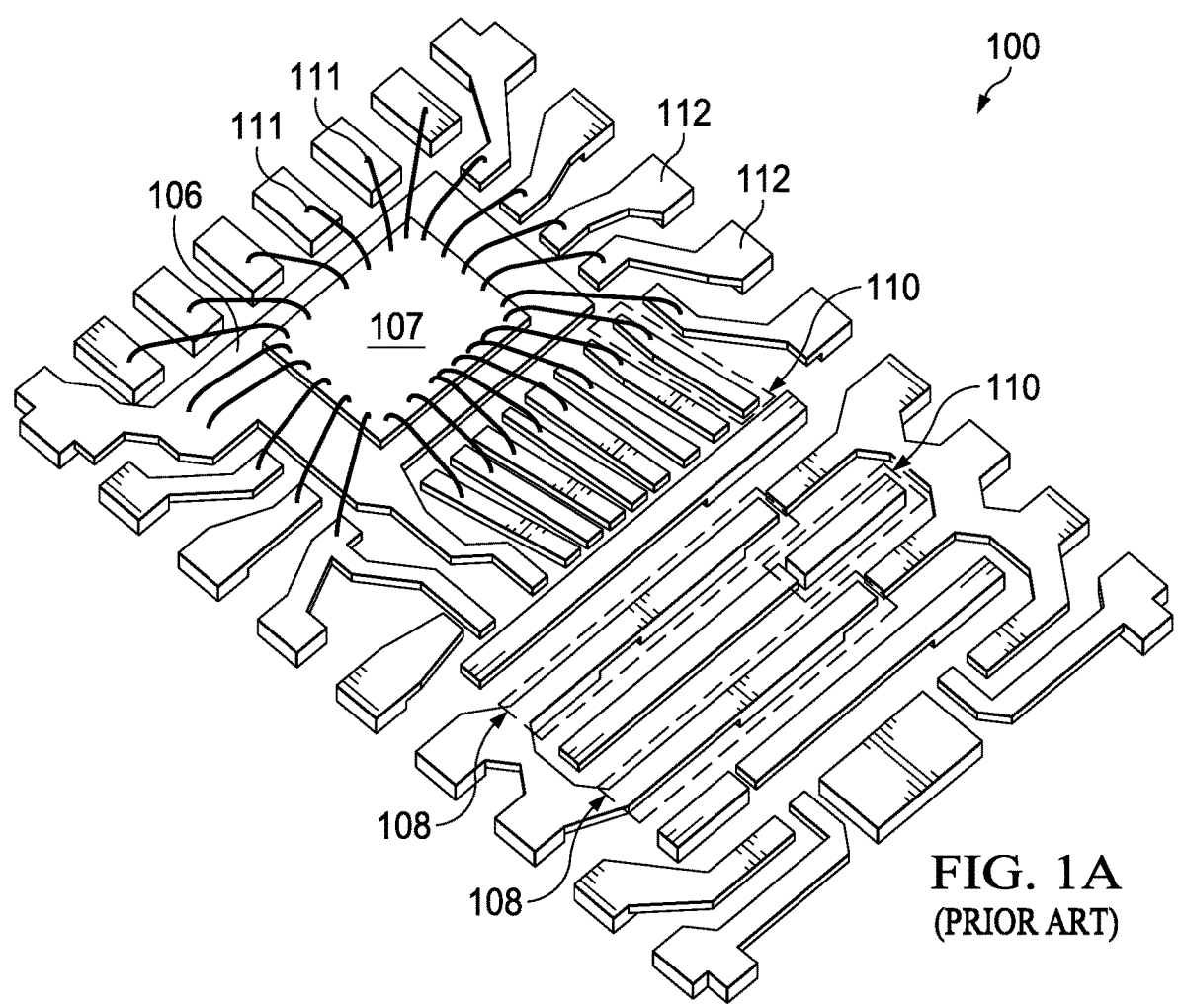
FIG. 1A shows a prior art example of a lead frame.
Figure 1B:
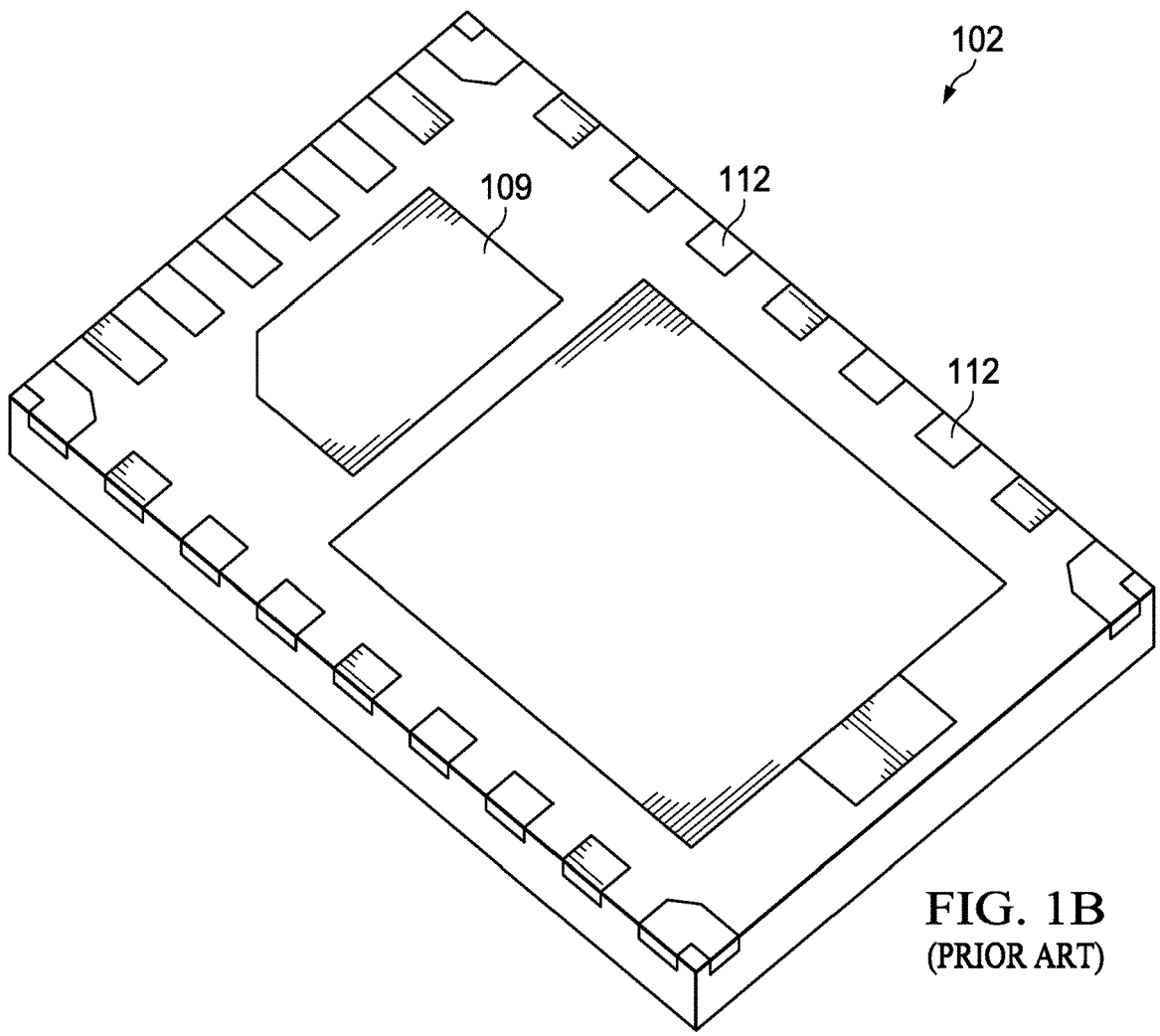
FIG. 1B shows a prior art example of a quad-flat no-leads (QFN) package.
Figure 1C:
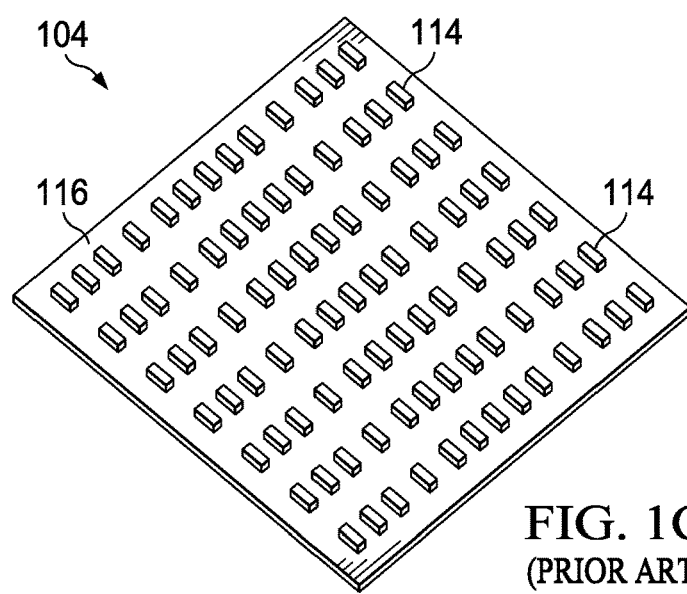
FIG. 1C shows a prior art example of a flip chip.
Figure 1D:
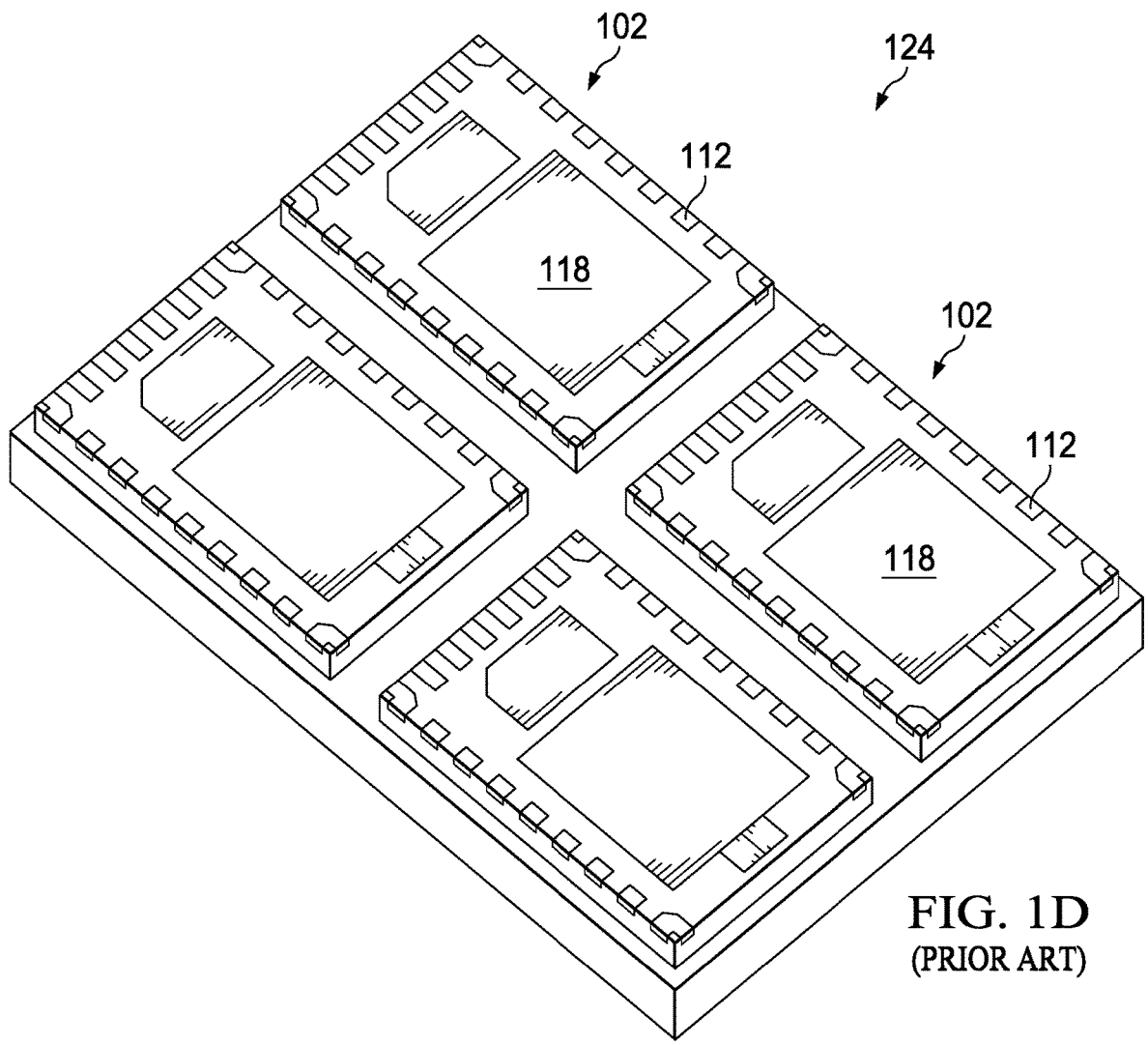
FIG. 1D shows a prior art example of multiple pre-singulation QFN lead frames 100 physically connected together in an array 124.
Figure 1E:
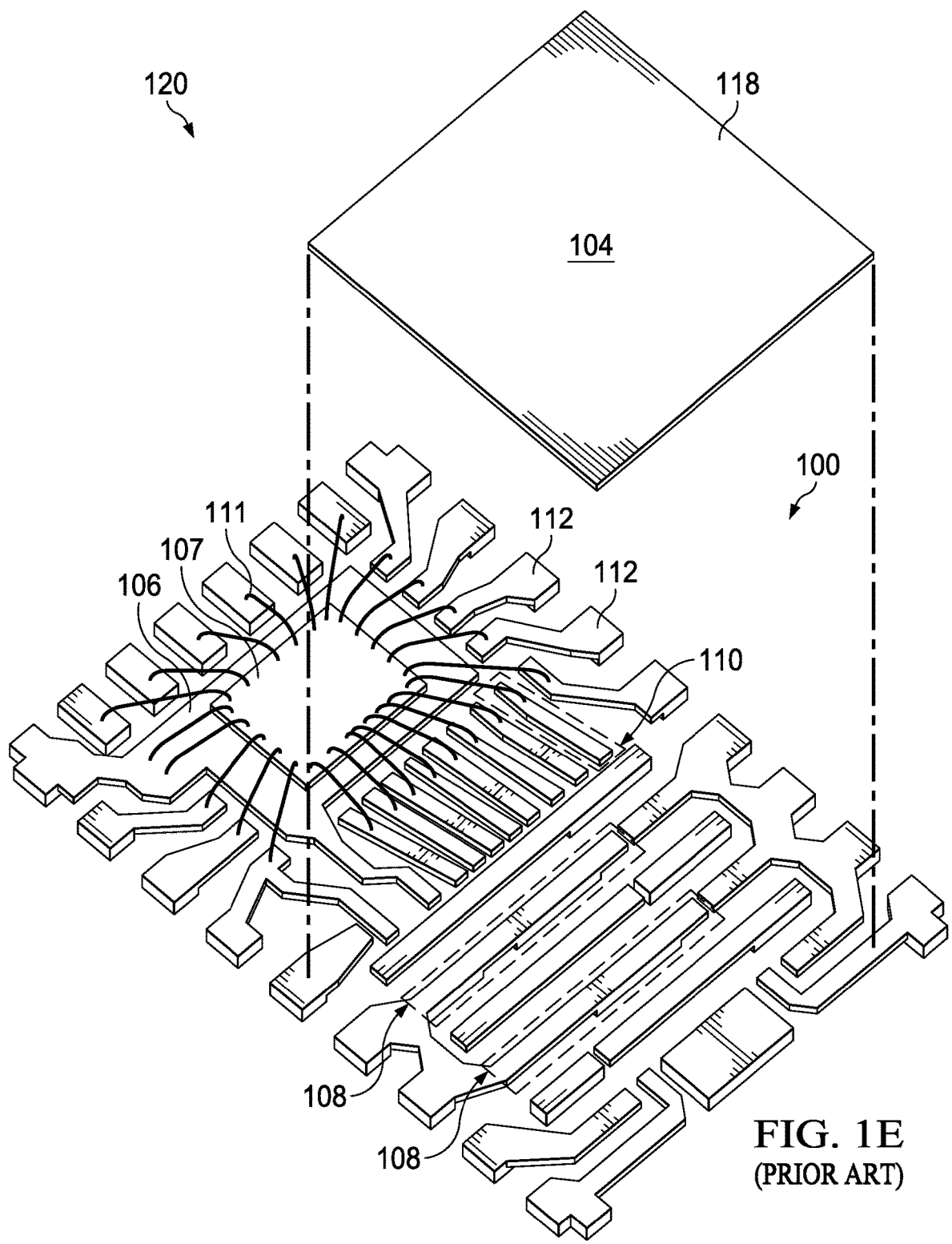
FIG. 1E shows a prior art example of a view of the flip chip being placed onto a lead frame, in which a bottom surface of the flip chip is visible.
Figure 1F:
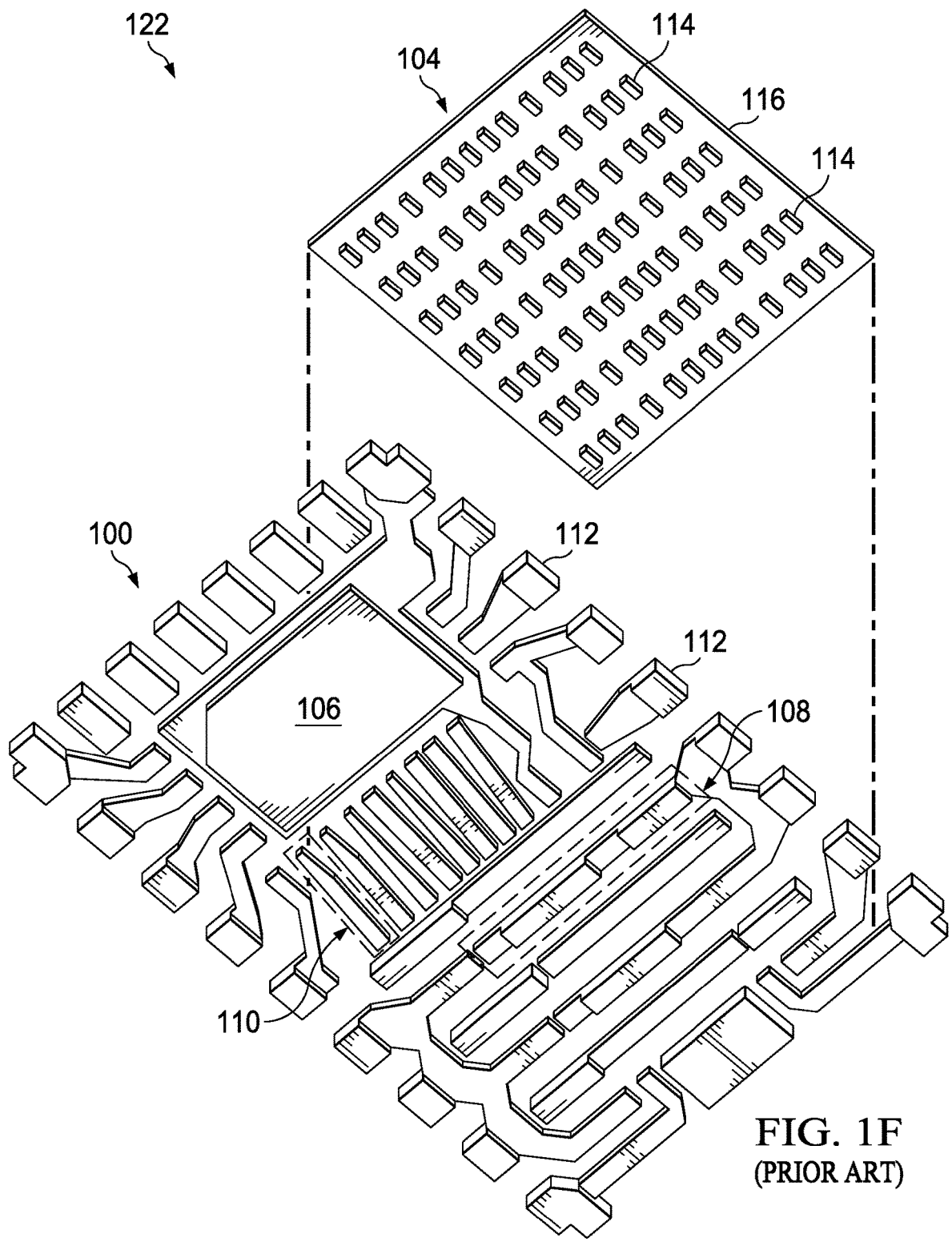
FIG. 1F shows a prior art example of a view of the flip chip being placed onto the lead frame, in which the top surface of the flip chip is visible.
Figure 2A:
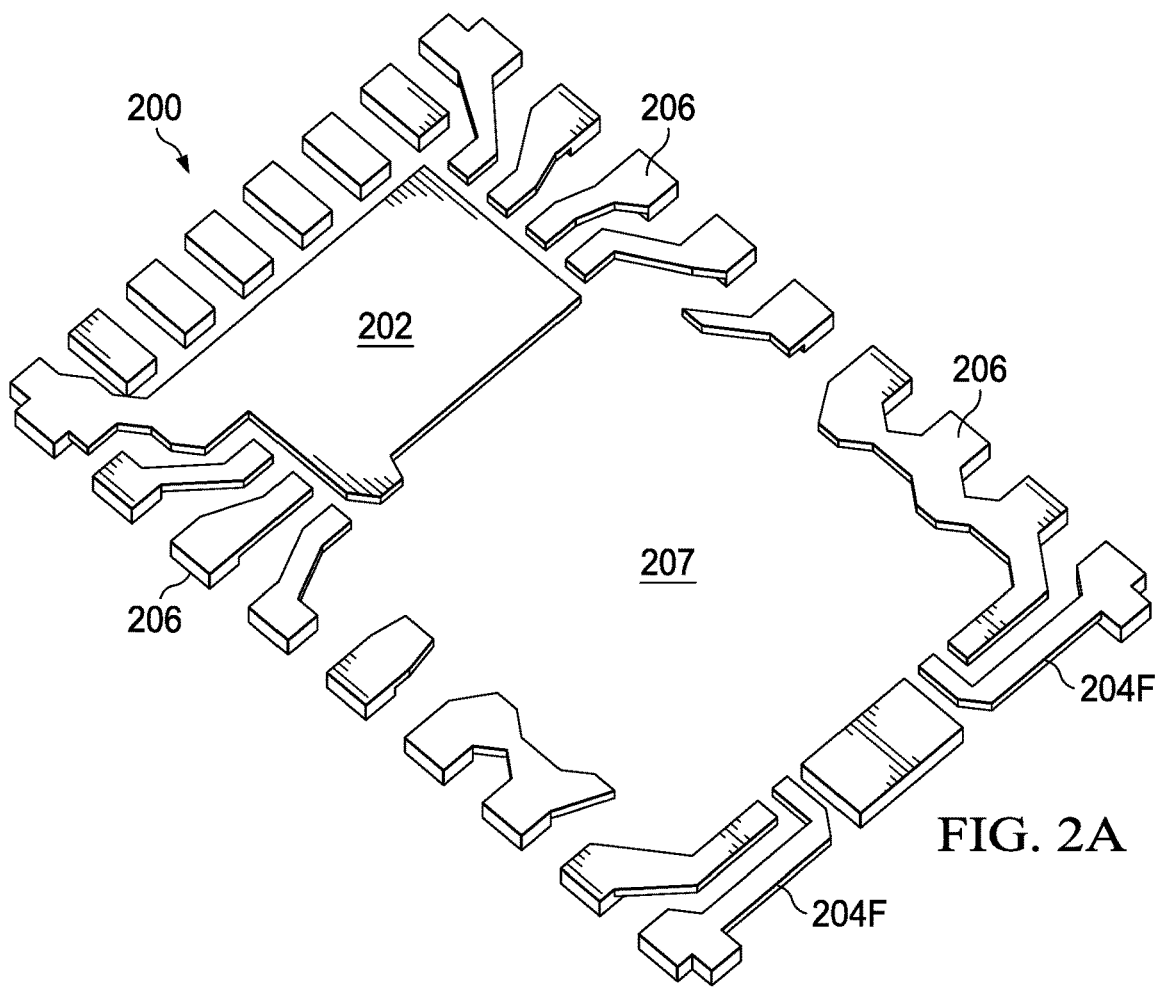
FIG. 2A shows an example of a pre-plated frame (PPF).

FIG. 2A shows an example of a pre-plated frame 200 (PPF 200). The PPF 200 of FIG. 2A is a copper lead frame plated with silver, nickel, or other conductive material to prevent oxidation of the copper and to enhance solderability of external contacts (connection points 206). The PPF 200 includes a die attach pad 202 on which a control integrated circuit (control IC, not shown) is mounted. The control IC 103 controls input and output functions of the fully assembled package 102. The PPF 200 also includes multiple conductive leads 204F. (Structures on the PPF 200 have an F appended to item numbers shared with the pre-molded interposer 208; structures on the pre-molded interposer 208, described with respect to FIG. 2B, have a C appended to item numbers shared with the PPF 200.) Leads 204F for the PPF 200 can be designed not to include floating leads 212 (not shown in FIG. 2A). Such floating leads 212 may be (but are not necessarily) limited to a pre-molded interposer 208, as described with respect to FIG. 2B. The leads 204F are electrically connected to respective external connection points 206 at selected perimeter locations of the PPF 200. The leads 204F and connection points 206 surround a hole or void 207 in the PPF 200. The hole 207 is sized and shaped to enable a pre-molded interposer 208 (as described in FIG. 2B) to be inserted into the hole 207. In particular, the interposer 208 is smaller than the hole 207. The interposer 208 can be sized to be smaller than the minimum size of the hole 207 in light of device fabrication tolerances. This "clearance" difference in size between the interposer 208 and the hole 207 can be bridged using solder. The leads 204F in the PPF 200 that terminate against (touch) the hole 207 enable connectivity to counterpart ones of the leads 204C in the pre-molded interposer 208, so that such connected counterparts are not floating leads 212—accordingly, the leads 204F that are touching the hole 207 can electrically connect the leads 204C in the pre-molded interposer 208 to the connection points 206.

Figure 2B:
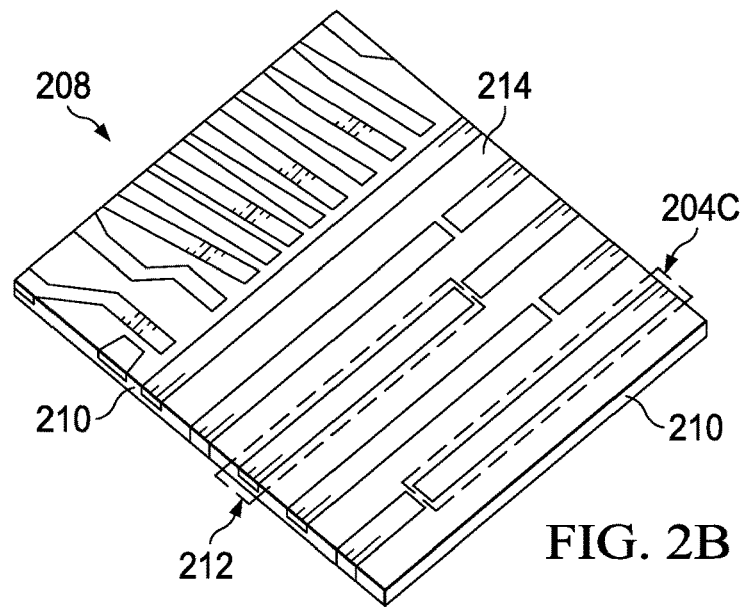
FIG. 2B shows an example of a pre-molded interposer.

FIG. 2B shows an example of the pre-molded interposer 208. The pre-molded interposer 208 comprises a molded shape made from a mold compound 210. Channels are created in a top surface 214 of the molded shape either using the mold (not shown), or by etching, drilling, milling, or otherwise creating channels in the top surface 214. The top surface 214 is plated to fill the channels with conductive material and thereby create the leads 204C in the top surface 214 of the pre-molded interposer 208 as shown in FIG. 2B. The plating material can be, for example, NiPdAu flash. This results in conductive leads 204C inside a matrix of molding compound 210. NiPdAu plating can be applied so that the excess plating material on the surface of the interposer 208 is less than 2 μm thick. This is thin enough so that excess plating material is generally insufficiently conductive to electrically connect the conductive leads 204C in a manner that would compromise their intended function. Accordingly, excess plating material on the interposer 208 is generally insufficient to prevent conductive leads 204C from conducting signals transmitted from a flip chip 104 via the flip chip's 104 conductive pads 114, to corresponding connection points 206. The flip chip 104 is not shown in FIG. 2B; interface between the flip chip 104, the interposer 208, and the PPF 200 is shown in, for example, FIGS. 3A, 3B, and 3C.

The conductive leads 204C can be floating leads 212 or non-floating leads after the pre-molded interposer 208 is attached to the PPF 200 (as further described below). The leads 204C are exposed on at least the top surface 214 of the pre-molded interposer 208. Whether leads 204C on the interposer 208 will be non-floating leads or floating leads 212 depends on whether or not (respectively) the leads 204C on the interposer 208 touch an exterior perimeter of the interposer 208 and will be aligned with non-floating leads on the PPF 200 once the interposer 208 is inserted into the hole 207 in the PPF 200.

Figure 2C:
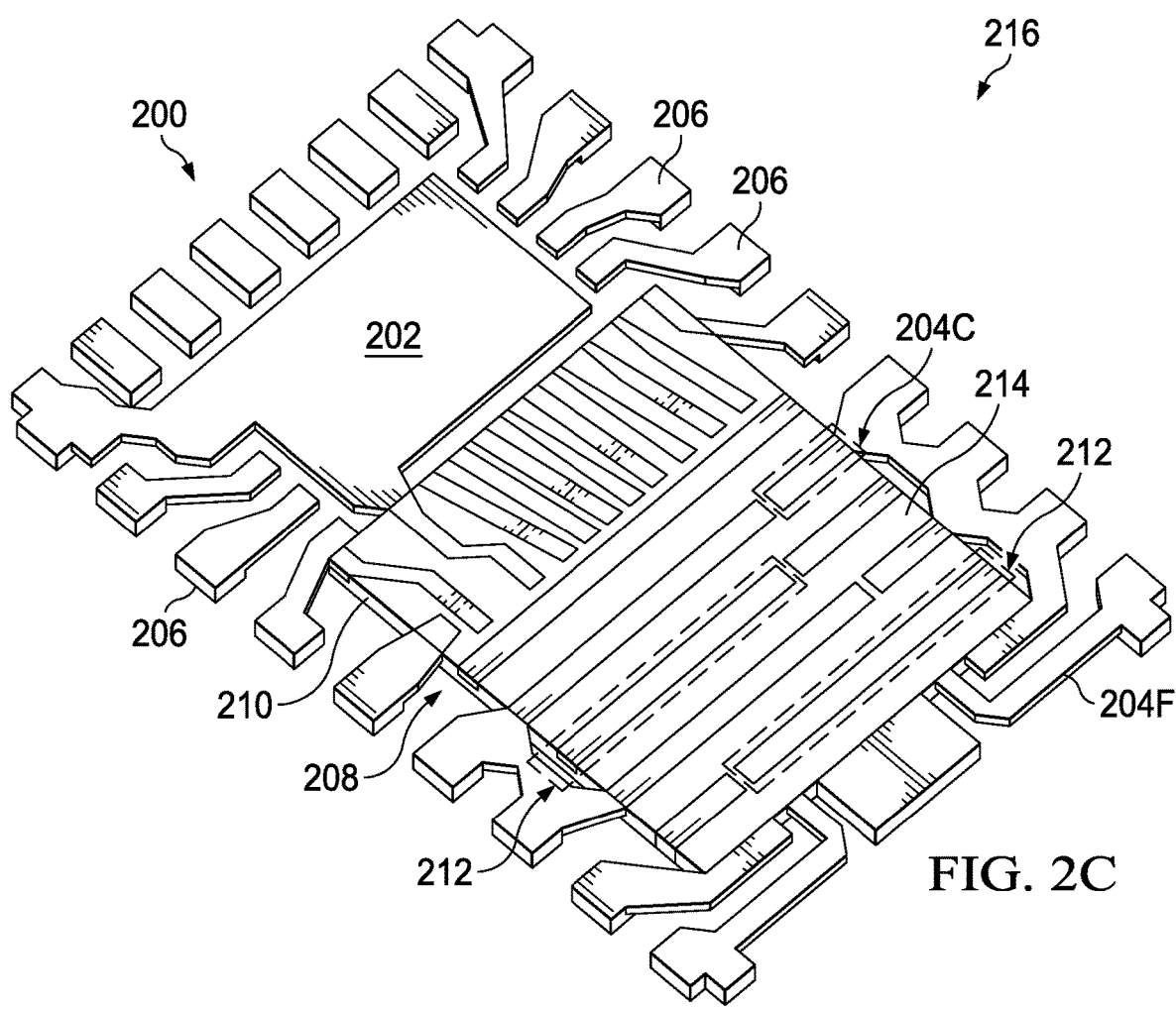
FIG. 2C shows an example view of the PPF assembled with the pre-molded interposer to form a lead frame.

FIG. 2C shows an example view of the PPF 200 assembled with the pre-molded interposer 208 to form a lead frame 216. As shown in FIG. 2C, the pre-molded interposer 208 is inserted into the PPF 200, with solder, sintering, or conductive paste (or other conductive medium) between corresponding leads 204F, 204C on the PPF 200 and the pre-molded interposer 208 to electrically connect portions of the PPF 200 to the pre-molded interposer 208. Sticky tape (or other means of holding the PPF 200 releasably in place) is used to hold the PPF 200 in a fixed position while the pre-molded interposer 208 is inserted into the PPF 200 to form the assembled lead frame 216. At least some of the conductive leads 204F, 204C are located to align with conductive pads 114 on a flip chip 104 (or other IC) so that the flip chip 104 can be electrically connected to the assembled lead frame 216 using solder balls.

Advantageously, use of the pre-molded interposer 208 to contain the floating leads 212 simplifies fabrication of the floating leads 212. The pre-molded interposer 208 enables floating leads 212 to be used in the lead frame 216 without need for additional process steps to separate the floating leads 212 from the rest of the lead frame 216. Accordingly, by including the floating leads 212 in the pre-molded interposer 208, rather than in the PPF 200, the floating leads 212 can be fabricated without using an etching or other separation process to physically and electrically separate the floating leads 212 from the rest of the lead frame 216. Further, use of the pre-molded interposer 208 enables the floating leads 212 to be held securely in place. The floating leads 212 are thereby precisely positioned, which can enable improved electrical connectivity of an integrated circuit (IC) to a lead frame 216 on which the IC is mounted.

Figure 3A:
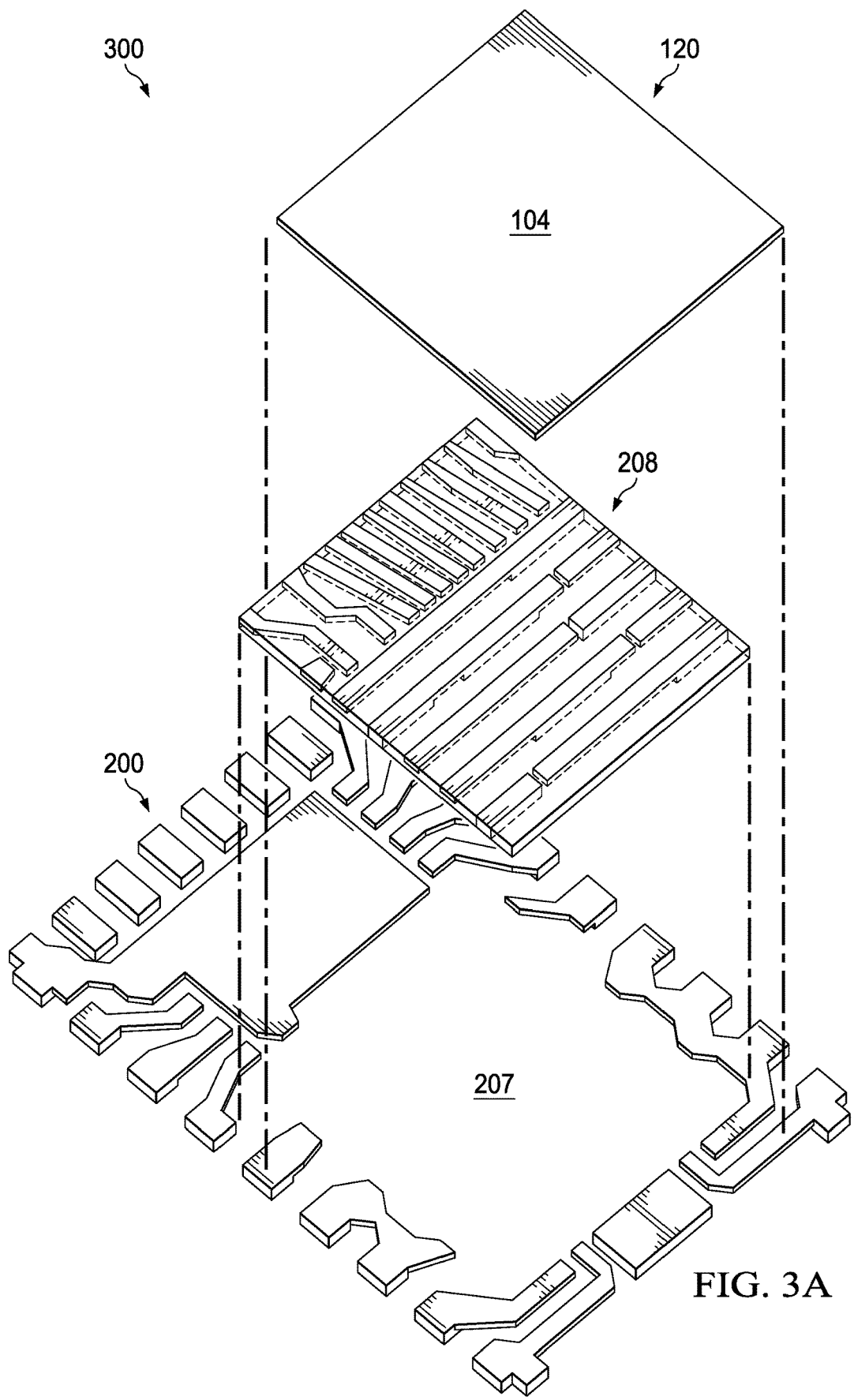
FIG. 3A shows an example exploded view of the PPF, pre-molded interposer, and flip chip, in which the bottom surface of the flip chip is visible.
Figure 3B:
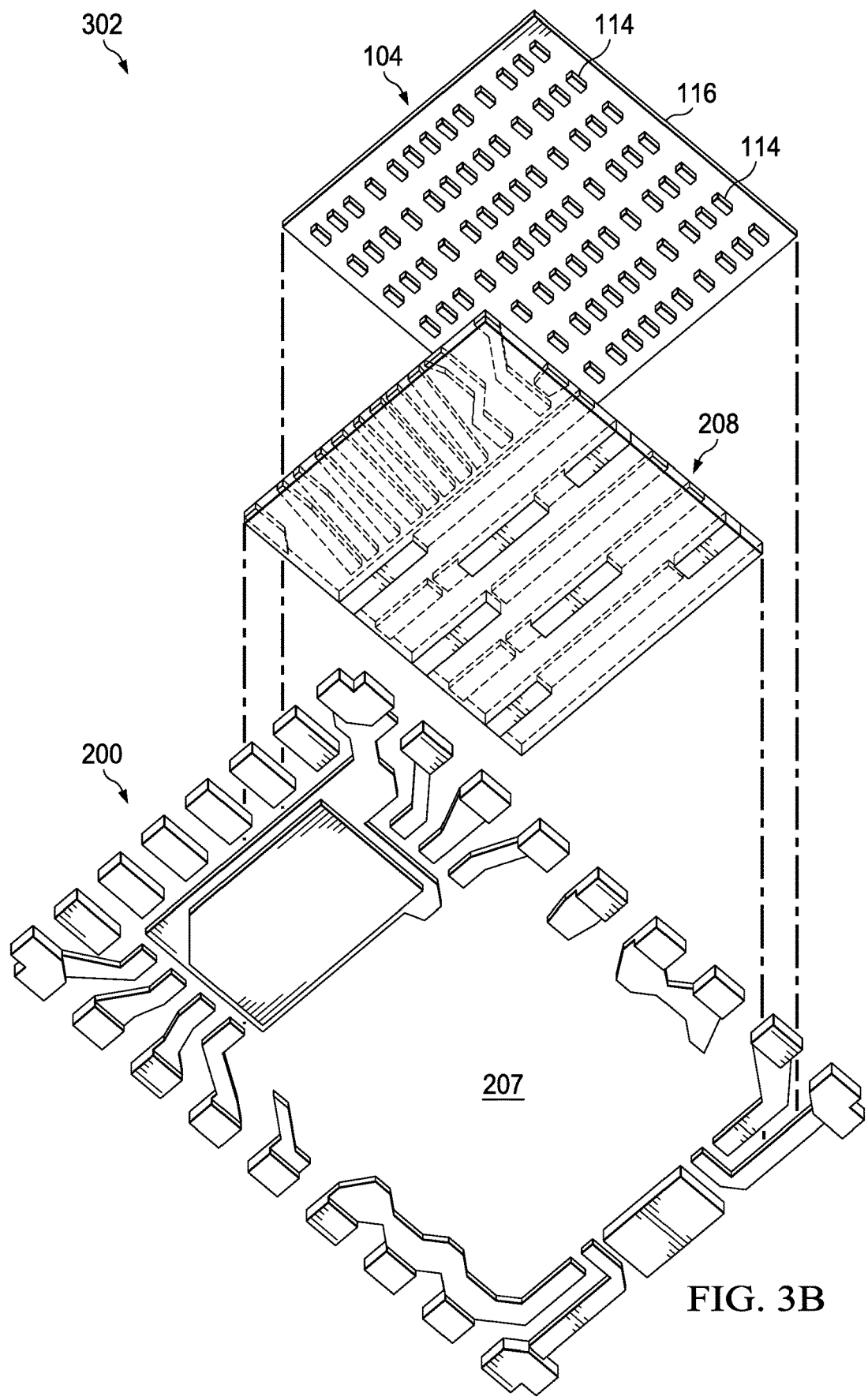
FIG. 3B shows an example exploded view of the PPF, pre-molded interposer, and flip chip, in which the top surface of the flip chip is visible.
Figure 3C:
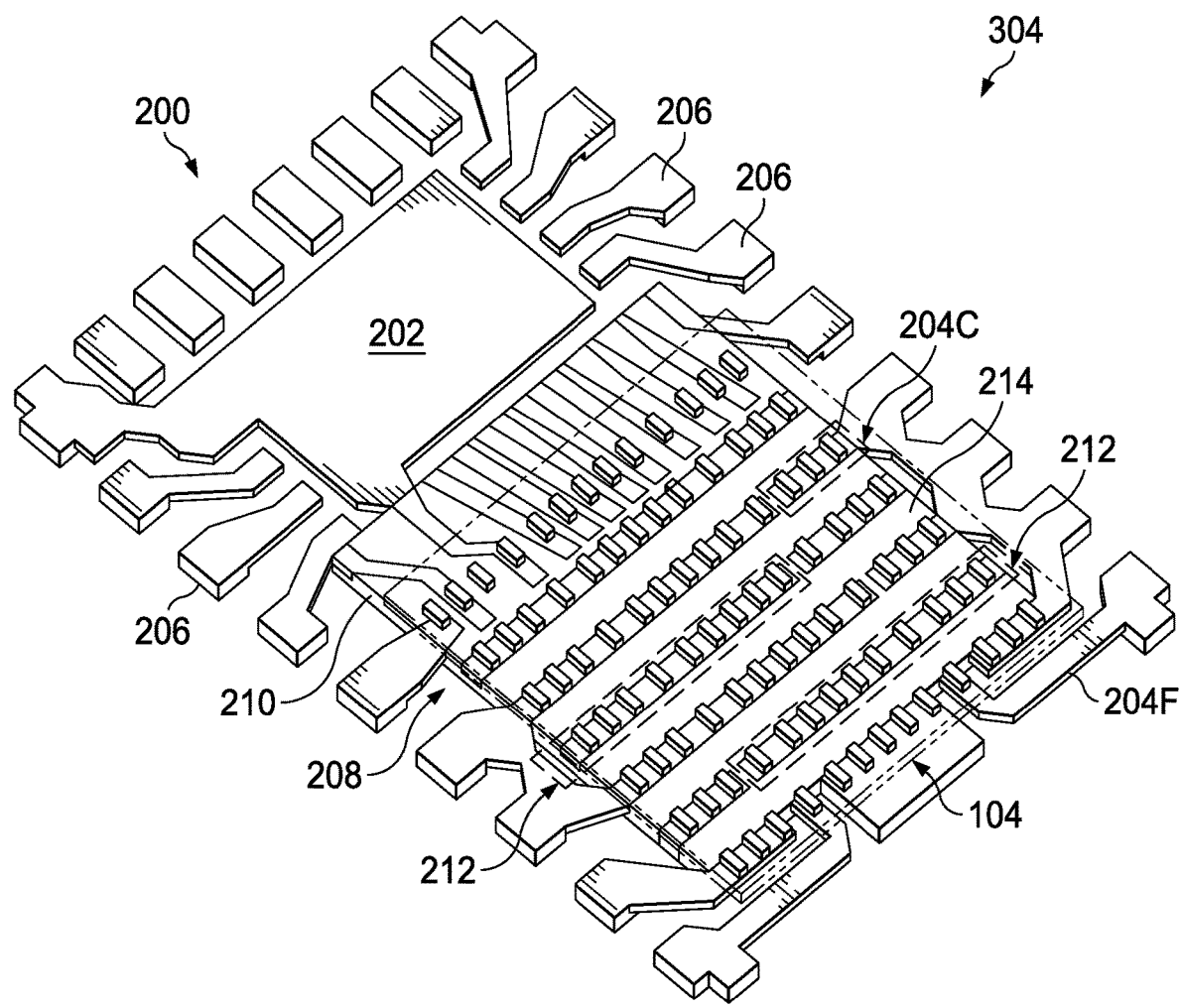
FIG. 3C shows an example view of the PPF assembled with a pre-molded interposer and a flip chip.
Figure 3D:
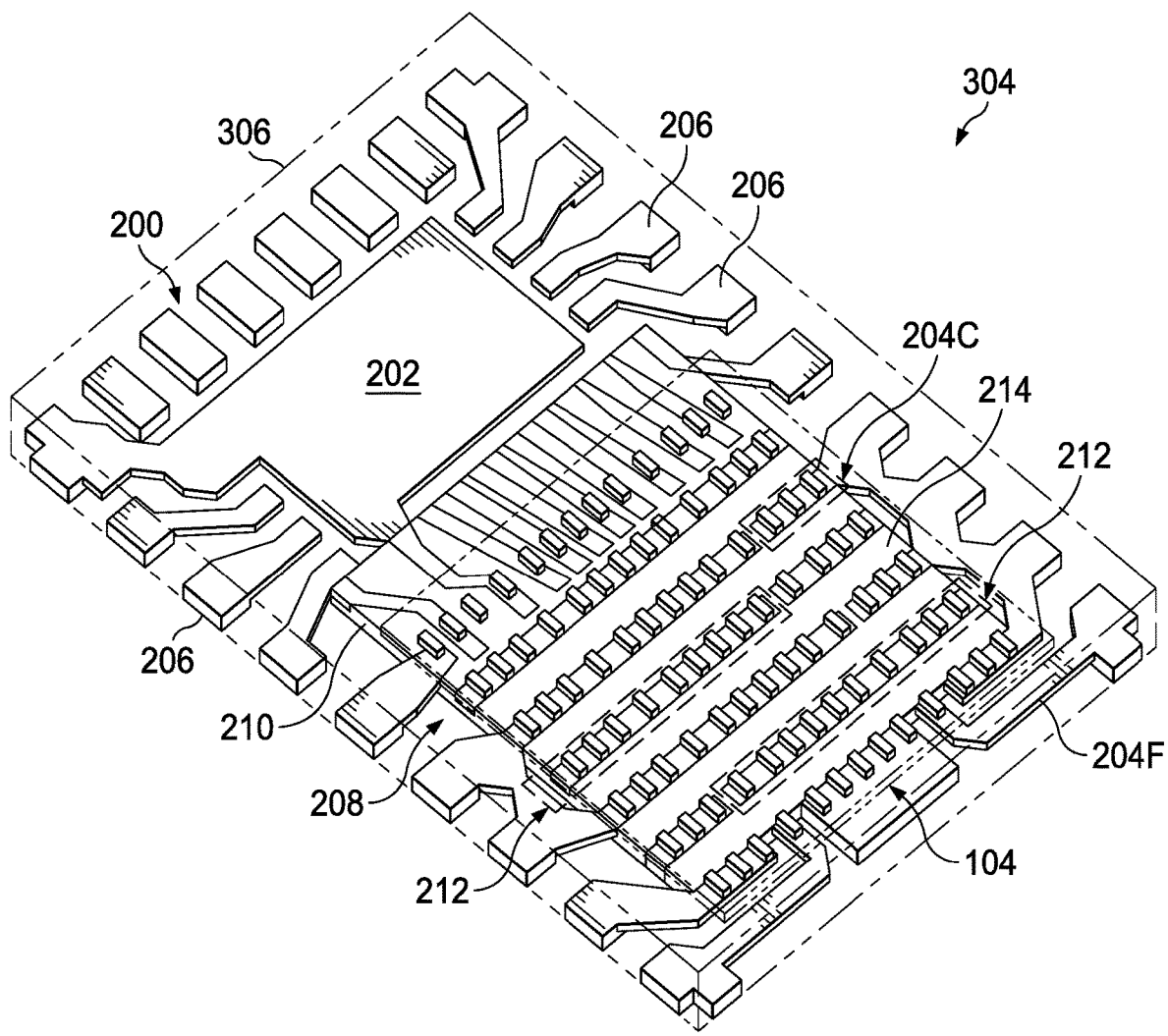
FIG. 3D shows an example view of the PDF assembled with a pre-molded interposer and a flip chip after being covered with mold material.

FIGS. 3A and 3B show respective upper and lower example exploded views 300 and 302 of the PPF 200, a molded interposer 208, and a flip chip 104, and FIG. 3C shows those items assembled into an assembled lead frame 304. Specifically, FIG. 3A shows an example exploded view 300 in which the bottom surface 118 of the flip chip 104 is visible, and FIG. 3B shows an example exploded view 302 in which the top surface 116 of the flip chip 104 is visible. As shown in FIG. 3C, the conductive leads 204F, 204C on the lead frame 216 (accordingly, on the PPF 200 and on the pre-molded interposer 208) are positionally aligned with, and electrically connected to, the conductive pads 114 on the flip chip 104. The flip chip 104 may connect to conductive leads 204F, 204C on the PPF 200 and on the pre-molded interposer 208, or may only connect to conductive leads 204C on the pre-molded interposer 208. FIG. 3D shows a mold 306 covered PDF assembled with a pre-molded interposer and a flip chip.

Figure 4:
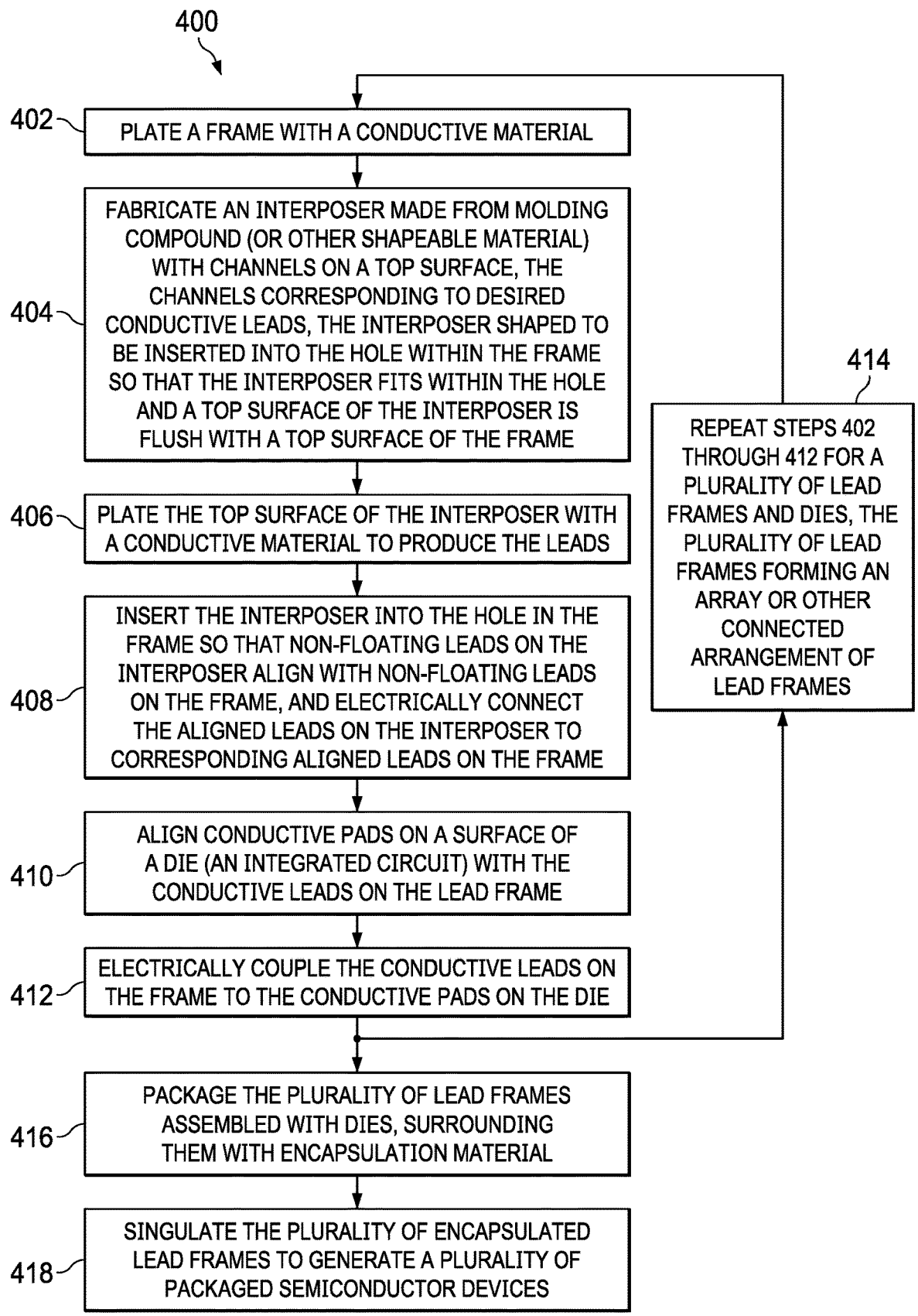
FIG. 4 shows an example process for assembling a lead frame with an integrated circuit.

FIG. 4 shows an example process 400 for assembling a lead frame with an integrated circuit. In step 402, plate a conductive frame with a (different) conductive material, such as silver or nickel, to inhibit oxidation of the frame material. The frame comprises conductive leads, preferably including non-floating leads, electrically connected to connection points. The connection points are located so that when the assembly is packaged (such as a quad flat no-leads package), conductive material is applied between the connection points and corresponding conductive points on the package. The leads and connection points surround a hole or void within the frame. One or more of the leads terminates against the hole.

In step 404, fabricate an interposer having conductive leads on a top surface of the interposer, the interposer shaped to be inserted into the frame hole or void so that the interposer fits within the hole or void and a top surface of the interposer is flush with a top surface of the frame. The interposer has channels on a top surface, the channels corresponding to desired conductive leads. Channels can be arranged so that, once filled with conductive material, leads formed in the channels of the interposer can be non-floating leads or floating leads once the interposer is inserted into the frame hole or void. Whether leads on the interposer will be non-floating leads or floating leads depends on whether or not (respectively) the leads on the interposer will be aligned with non-floating leads on the frame once the interposer is inserted into the hole or void in the frame. In step 406, the channels on the top surface of the interposer are filled with a conductive material to produce the leads.

In step 408, insert the interposer into the hole in the frame so that non-floating leads on the interposer align with non-floating leads on the frame, and electrically connect the aligned leads on the interposer to corresponding aligned leads on the frame using solder, sintering, conductive paste, or other conductive material.

In step 410, align conductive pads on a surface of a die (an integrated circuit) with the conductive leads on the lead frame. In step 412, electrically couple the conductive pads on the die to the conductive leads on the frame, such as by using solder balls.

In step 414, repeat steps 402 through 412 for a plurality of lead frames and dies, the plurality of lead frames forming an array or other connected arrangement of lead frames. In step 416, the plurality of lead frames assembled with dies is packaged, surrounding them with encapsulation material. In step 418, the plurality of encapsulated lead frames is singulated (for example, by sawing) to generate a plurality of packaged semiconductor devices.

Modifications are possible in the described embodiments, and other embodiments are possible, within the scope of the claims.

In some embodiments, package types other than QFN are used.

In some embodiments, a top surface of an interposer inserted into a frame is not flush with a top surface of the frame.

In some embodiments, the PPF is plated with NiPdAU.

In some embodiments, a frame that is not pre-plated is used instead of a PPF.

In some embodiments, an interposer is made other than by molding; for example, using three dimensional printing, or by drilling, etching, or milling.

In some embodiments, channels on the interposer are filled with conductive material to form conductive leads, in a manner other than by plating the top surface of the interposer.

In some embodiments, conductive material on a plated surface of the interposer that is not contained within a channel is removed from the plated surface of the interposer.

In some embodiments, the interposer is attached to the PPF using structure on the PPF other than a conductive lead.

In some embodiments, the clearance difference in size between the interposer and the hole is bridged using a conductive or non-conductive material other than solder.

What is claimed is:
1. A packaged semiconductor device, comprising:
    a frame, the frame including multiple conductive frame leads and multiple conductive connection points, and including a hole in the frame surrounded by the frame leads and the conductive connection points;
    an interposer having an external perimeter including multiple conductive interposer leads, the interposer for insertion into the hole, at least one of the interposer leads not extending to the external perimeter; and
    an integrated circuit die electrically coupled to selected ones of the frame leads and selected ones of the interposer leads,
    wherein the interposer is inserted into the hole and coupled to the frame, and the frame, the interposer, and the integrated circuit die are together encapsulated by an encapsulation material.
2. The packaged semiconductor device of claim 1, wherein at least one of the interposer leads extends to the external perimeter, aligns with a corresponding one of the frame leads touching the hole, and is electrically coupled to the corresponding frame lead by at least one of: solder, sintering, and conductive paste.
3. The packaged semiconductor device of claim 1, wherein the conductive leads on the frame and on the interposer are arranged to align with conductive pads on a surface of the integrated circuit die.
4. The packaged semiconductor device of claim 1, wherein the frame is plated with silver, nickel or NiPdAu.
5. The packaged semiconductor device of claim 1, wherein the conductive interposer leads comprise NiPdAu flash.
6. The packaged semiconductor device of claim 1, wherein a surface of the interposer that includes the interposer leads is flush with a surface of the frame that includes the frame leads.
7. The packaged semiconductor device of claim 1, wherein the interposer comprises molding compound.
8. The packaged semiconductor device of claim 1, wherein the interposer is made using a mold, the interposer leads are fabricated in channels on a surface of the interposer, and the channels are made using the mold, or using one or more of: drilling, etching, or milling.
9. The packaged semiconductor device of claim 1, wherein the frame is a plated frame.
10. The packaged semiconductor device of claim 1, wherein the connection points are configured to electrically couple the frame leads to a printed circuit board connection package.
11. The packaged semiconductor device of claim 1, wherein the interposer leads are in channels on a surface of the interposer, and the interposer leads are fabricated by plating a surface of the interposer that includes the channels with a conductive material.
12. The packaged semiconductor device of claim 1, wherein the integrated circuit die is flip chip coupled to selected ones of the frame leads and selected ones of the interposer leads.
13. A packaged semiconductor device, comprising:
    a frame having a hole surrounded by multiple conductive frame leads connected to multiple connecting points, the connecting points arranged to electrically connect the frame to a printed circuit board (PCB) connection package;
    an interposer with a conductive material in multiple channels forming conductive interposer leads, the inter- poser shaped to fit in the hole, wherein the interposer is positioned within the hole and attached to the frame;

an integrated circuit die electrically coupled to selected ones of the frame leads and selected ones of the interposer leads; and an encapsulation material surrounding the frame, the interposer, and the integrated circuit die.

14. The packaged semiconductor device of claim 13, wherein conductive pads on a surface of the integrated circuit die are aligned with corresponding ones of the frame leads and the interposer leads, and the conductive pads are electrically coupled to the corresponding ones of the frame leads and the interposer leads.

15. The packaged semiconductor device of claim 14, wherein the conductive pads are electrically and mechanically coupled to the corresponding ones of the frame leads and the interposer leads using solder balls.

16. The packaged semiconductor device of claim 14, wherein the electrically coupled frame and integrated circuit die are electrically coupled to a PCB connection package using the connecting points.

17. The packaged semiconductor device of claim 13, wherein at least one of the conductive interposer leads is a floating lead.

18. The packaged semiconductor device of claim 13, wherein the interposer, including the channels, is made of mold material.

19. The packaged semiconductor device of claim 13, wherein non-floating leads on the interposer are electrically coupled to non-floating leads on the frame using one or more of: solder, sintering, and conductive paste.

20. The packaged semiconductor device of claim 13, wherein a surface of the interposer that includes the interposer leads is flush with a surface of the frame that includes the frame leads.

* * * * *